United States Patent
Kanareykin et al.

(10) Patent No.: US 11,773,026 B2
(45) Date of Patent: Oct. 3, 2023

(54) DC BULK CONDUCTIVE CERAMIC WITH LOW RF AND MICROWAVE LOSS

(71) Applicant: Euclid Techlabs, LLC, Solon, OH (US)

(72) Inventors: Alexei Kanareykin, Bethesda, MD (US); Elizaveta Arkadievna Nenasheva, Saint-Petersburg (RU)

(73) Assignee: Euclid Techlabs, LLC, Solon, OH (US)

( * ) Notice: Subject to any disclaimer, the term of this patent is extended or adjusted under 35 U.S.C. 154(b) by 432 days.

(21) Appl. No.: 17/019,441

(22) Filed: Sep. 14, 2020

(65) Prior Publication Data
US 2022/0081366 A1    Mar. 17, 2022

(51) Int. Cl.
*C04B 35/46*    (2006.01)
*H01J 37/32*    (2006.01)
*C04B 35/64*    (2006.01)

(52) U.S. Cl.
CPC .............. *C04B 35/46* (2013.01); *C04B 35/64* (2013.01); *H01J 37/32082* (2013.01); *H01J 37/32192* (2013.01); *C04B 2235/604* (2013.01); *C04B 2235/6584* (2013.01)

(58) Field of Classification Search
None
See application file for complete search history.

(56) References Cited

U.S. PATENT DOCUMENTS

| | | | |
|---|---|---|---|
| 2009/0242827 A1* | 10/2009 | Nakahata | C04B 35/2658 252/62.62 |
| 2010/0147348 A1* | 6/2010 | Backhaus-Ricoult | C04B 35/58014 136/201 |
| 2020/0013665 A1* | 1/2020 | Kim | B28B 11/243 |

OTHER PUBLICATIONS

Sannibale, F. "Overview of Recent Progress on High Repetition Rate, High Brightness Electron Guns", IEEE. 2020. 4160-4164 Lawrence Berkeley National Laboratory, Berkeley, CA, USA.

* cited by examiner

*Primary Examiner* — Mohammad M Ameen
(74) *Attorney, Agent, or Firm* — Maine Cernota & Rardin (57) ABSTRACT

A DC conductive, low RF/microwave loss titanium oxide ceramic provides, at room temperature, a bulk DC resistivity of less than $1\times10^{11}$ ohm-meters and an RF loss tangent of less than $2\times10^{-4}$ at 7.5 GHz and less than $2\times10^{-5}$ at 650 MHz. The resistivity is reduced by oxygen vacancies and associated $Ti^{3+}$ and/or $Ti^{4+}$ centers created by sintering in an atmosphere containing only between 0.01% and 0.1% oxygen. The reduced resistivity prevents DC charge buildup, while the low loss tangent provides good RF/microwave transparency and low losses. The ceramic is suitable for forming RF windows, electron gun cathode insulators, dielectrics, and other components. An exemplary $Mg_2TiO_4$—$MgTiO_3$ embodiment includes mixing, grinding, pre-sintering in air, and pressing 99.95% pure MgO and $TiO_2$ powders, re-sintering in air at 1400° C.-1500° C. to reduce porosity, and sintering at 1350° C.-1450° C. for 4 hours in an 0.05% oxygen and 99.05% nitrogen atmosphere.

18 Claims, 7 Drawing Sheets

DC BULK CONDUCTIVE CERAMIC WITH LOW RF AND MICROWAVE LOSS

STATEMENT OF GOVERNMENT INTEREST

Portions of the present invention may have been made in conjunction with Government funding under the US Department of Energy SBIR Grant #DE-SC0017150, and there may be certain rights to the Government.

FIELD OF THE INVENTION

The invention relates to high, middle, and low energy particle beam apparatus, and more particularly, to ceramic insulators, windows, dielectrics, and other ceramic components incorporated within RF and microwave devices, including beam apparatus.

BACKGROUND OF THE INVENTION

Ceramics are often used in various RF and microwave devices including high, middle, and low energy particle beam apparatus to form insulators, dielectrics, vacuum chamber walls, and vacuum-tight windows through which RF energy can enter or leave a vacuum space. The utility of ceramics for these applications arises from their high DC bulk resistivity (low conductivity) and low dielectric losses at RF and microwave frequencies, in combination with the tolerance of many ceramics to extreme temperatures, resistance to high energy particle impacts, and gas-impenetrability.

It will be understood that unless otherwise required by context, the terms "RF," "microwave," and "RF/microwave" are used herein interchangeably to refer to electromagnetic radiation that is at any frequency between 100 MHz and 200 GHz. It will further be understood that, unless otherwise required by context, the terms "resistivity" and "bulk resistivity" are used herein interchangeably to refer to the DC bulk resistivity of a material, reported in units of Ω×m, and that the term "conductivity" is used herein to refer to the inverse of the DC bulk resistivity of a material.

In particular, the very low RF and microwave power dissipation, of many ceramics causes them to be nearly transparent to RF and microwave frequencies, thereby allowing ceramic materials to be used as RF and microwave windows and as insulators and dielectrics in proximity to RF and microwave energy with minimal loss of RF and microwave power. The small but finite RF/microwave losses of a ceramic are often characterized in terms of the angle d that the complex impedance vector of the ceramic material makes with the imaginary axis, or by the tangent of d. In particular, a hypothetical ceramic that had no losses at RF and microwave frequencies would have a purely imaginary (i.e. purely dielectric) complex impedance, such that d would be zero. In practice, there is always some very small but finite amount of loss for any ceramic, but nevertheless d is typically very low. Note that in general, the value of d, and hence of tan d, depends upon the RF/microwave frequency.

One example where ceramic materials are often used in high, middle, and low energy beam apparatus is in high-power RF/microwave couplers that connect RF transmission lines to conventional (normal conducting) RF cavities or to superconducting RF cavities (SRF cavities) that use RF energy to accelerate beams of electrons or other charged particles. Such RF couplers typically include a ceramic window that allows RF power to pass through with minimal attenuation while maintaining the vacuum integrity of the cavity.

Another example is in the design of so-called "DC" electron guns that produce continuous or quasi-continuous electron beams, where the base of the cathode electrode, and/or its support structure, are located within a ceramic insulator that supports the cathode potential. Ceramic components are also used in DC electron guns as insulators that surround the electron beam as it is accelerated along the length of the gun.

Unfortunately, the very high DC bulk resistivity of ceramics can lead to a buildup of electrical charge on ceramic components that are used in high, middle, and low energy particle apparatus, which in turn can lead to arcing, surface flashover, punch-through failure of the ceramic (with consequent loss of the vacuum), and other unwanted side effects that can cause damage to the apparatus, thereby resulting in added costs and downtime while repairs are made.

The causes of electric charge buildup (i.e. DC field buildup) on ceramic components in charged particle beam apparatus are, in general, not fully understood, and are believed to arise from any combination of several different processes. In an electron gun, for example, high RF fields can cause electron emission from the cathode metal-vacuum-ceramic interface ("triple junction"), whereupon some of these "field emission" electrons can strike the surface of a ceramic component, generating many more free electrons because the secondary electron yield (SEY) coefficient is high for most ceramics. These electrons penetrate a relatively short distance into the ceramic, and can result in a substantial DC electric charge on the surfaces of the ceramic components, thereby increasing the electric field near the triple junction, and further increasing the field-emitted current.

X-rays generated by field emission in a cavity or other particle beam apparatus can also produce free electrons at the location of a ceramic window or other ceramic component by photoemission or Compton scattering. In addition, X-rays passing through a ceramic RF window at energies that are substantially attenuated by the window material can, by photoemission, produce differential surface and volume charging of the window.

For high power windows, possible mechanisms that can generate electric charge include surface and volume charging by localized field emission, X-ray deposition, beam halo, and the "multipactor" effect. In particular, the breakdown of alumina RF windows appears to be mostly caused by the "multipactor" effect (electron multiplication on the surface), and/or the discharge of accumulated charges that can result from the multipactor effect as well as from material defects and surface contamination.

For all of these reasons, the development of ceramic RF windows for use in the output section of high-power RF sources is an especially important issue for particle accelerators. Charge buildup on the ceramic materials (usually alumina) that are commonly used for the RF windows in both normal conducting and superconducting cavities is one of the most troublesome issues in accelerator reliability.

One approach to avoiding charge buildup on ceramic elements within charged particle beam apparatus is to use a ceramic that has both a finite bulk resistivity and a suitable sheet surface resistivity on its inner surface that will allow any accumulated charge to be dissipated before a catastrophic failure can occur. At the same time, however, it is desirable that the loss tangent at RF and microwave frequencies of any such ceramics remain low to reduce RF/microwave losses and prevent overheating of the ceramic elements. Accordingly, the optimal bulk DC resistivity for a ceramic that is used in particle beam apparatus applications represents a compromise between minimizing RF power loss and providing sufficient conductivity to prevent DC electric charge buildup.

The optimal bulk resistivity for ceramic materials used in particle beam apparatus will depend upon the specific application. Reducing the DC bulk resistivity should not affect significantly the loss tangent of ceramic at RF and microwave frequencies. The typical loss tangent of commercially available microwave ceramics is about $10^{-4}$ in the 1-10 GHz frequency range. Significant RF/microwave power dissipation can occur in ceramics having loss tangents greater than $10^{-3}$. Accordingly, it is desirable to find ways to produce or modify ceramics so that their DC bulk resistivities are reduced while at the same time their RF/microwave loss tangents are minimized.

Several approaches have been proposed for adjusting the DC bulk resistivity or sheet resistivity of ceramics so as to eliminate the problem of DC charge buildup on ceramic components in high power beam apparatus. One possibility is to increase the bulk conductivity of the ceramic by doping. Unfortunately, there have been no successfully demonstrated and published results according to this approach.

Any of several processes can be used to provide a suitable sheet surface conductivity on the inner surface of a ceramic component. For example, a very thin TiN or Ti oxide coating can be applied that has been made partially conducting by doping the coating with metallic impurities during deposition by magnetron sputtering. Another approach is to use a metal ion implantation process.

Alumina windows have been coated with 1.5 nm thick TiN films in order to suppress the "multipactor" effect. However, this approach can be difficult and expensive to apply to large ceramic components. Furthermore, the metal ions penetrate less than 1 μm into the ceramic, whereas ideally the sheet surface conductivity should have an effective thickness that is comparable to the electron penetration depth. Another approach is to diffuse a high-resistance coating into the ceramic to a desired depth. Nevertheless, none of these methods is able to discharge the bulk ceramic component of an RF/microwave window or any other dielectric elements of charged particle beam apparatus.

Yet another approach to avoiding charge buildup on ceramic components is to include metallic shields within the charged particle beam apparatus that prevent field-emitted electrons from reaching ceramic components. However, this approach is suitable only for certain applications, and generally complicates the design of the apparatus and adds production steps, increasing costs and reducing the reliability of the apparatus.

In general, most of the approaches that have been tried so far for avoiding DC charge buildup on and inside of ceramic components within charged particle beam apparatus are complex and expensive, and none of them has proven completely successful.

What is needed, therefore, is a method of producing a ceramic material that is suitable for forming components implemented in a charged particle based apparatus, where the method of manufacture enables adjustment of the ceramic's bulk conductivity so that it has a sufficient bulk conductivity to avoid component damage due to DC electrical charge buildup, while at the same time maintaining sufficiently low dielectric losses at RF/microwave frequencies to maintain RF/microwave transparency and minimize RF/microwave power loss.

SUMMARY OF THE INVENTION

The present invention is a conductive titanium oxide ceramic (referred to herein as a "TiO" ceramic), and a method of manufacture thereof, wherein the ceramic includes $Ti^{3+}$ and/or $Ti^{4+}$ centers due to oxygen vacancies created by sintering the ceramic in a reduced oxygen environment. Here, "TiO" refers to any ceramic that includes titanium and oxygen in any ratio, for example $TiO_2$, $Ti_2O_3$, etc.

Before the disclosed sintering method is applied, these TiO ceramics have bulk resistivities in the range of $10^{13}$ to $10^{15}$, as is typical for dielectric materials that are conventionally used to form components implemented in charged particle beam apparatus. However, as a result of applying the process disclosed herein, the bulk resistivity of the claimed ceramic material is reduced by two to three orders of magnitude, while the loss tangent is increased by only about a factor of 2. Furthermore, in embodiments the conductivity of the disclosed ceramic materials can be optimized for each desired implementation by adjusting the oxygen concentration during sintering.

Some embodiments are based on an MgO—CaO—$TiO_2$ ceramic composition (referred to herein as an "MCT" ceramic) having a dielectric constant of between 18 and 140. Other embodiments are based on an MgO—$TiO_2$ ceramic composition (referred to herein as an "MT" ceramic) having a dielectric constant between 13 and 18. An exemplary embodiment is a $Mg_2TiO_4$—$MgTiO_3$ ceramic composition (referred to herein as a "MgTi" ceramic), having a DC bulk resistivity at room temperature that is reduced from a pre-sintered value of about $1 \times 10^{13} \Omega \times m$ down to a resistivity after sintering of only between $5 \times 10^{10}$ and $1 \times 10^{11} \Omega \times m$. At the same time, the disclosed sintering process increases the loss tangent of the MgTi ceramic of the exemplary embodiment by only about a factor of 2, from about $8 \times 10^{-5}$ up to about $1.7 \times 10^{-4}$ at 7.5 GHz, and from about $7 \times 10^{-6}$ up to about $1.4 \times 10^{-5}$ at 650 MHz.

In embodiments, as the temperature of the disclosed TiO based ceramic is increased, its DC bulk resistivity can be further decreased by 3-4 orders of magnitude. For example, as the temperature of the exemplary MgTi ceramic embodiment is increased from room temperature to 150° C., its DC bulk resistivity is further decreased by 3 orders of magnitude, from $10^{10} \Omega \times m$ to below $10^7 \Omega \times m$, while the loss tangent is increased by only about 20%. Heating the same MgTi ceramic from room temperature to 300° C. results in an increase in conductivity of about eight orders of magnitude.

In embodiments, this variability of the bulk resistivity with temperature provides an additional method of discharging the ceramic components of charged particle beam apparatus by periodically heating the system, or by operating the system at an elevated temperature. In addition, this dependence of the conductivity on temperature can also be used as a mechanism for adjusting the bulk conductivity of a component made using the disclosed ceramic materials to meet specific implementation requirements.

The disclosed ceramic materials are therefore suitable for forming components that are implemented in charged particle based apparatus, such as accelerators, vacuum electronic devices, electron microscopes, and such like, in that they have a sufficient bulk conductivity to avoid component damage due to DC electrical charge buildup, while at the same time maintaining a sufficiently low loss tangent to maintain RF/microwave transparency and minimize RF/microwave power loss.

The method of manufacturing the disclosed ceramic materials, according to the present invention, includes preparing a mixture of precursor ceramic powders that includes a titanium-oxide based ceramic powder, pressing the mixed powders into a desired shape; and sintering the pressed powders in an atmosphere having an oxygen concentration that is reduced in comparison to air.

In embodiments, after grinding and mixing the precursor ceramic powders, the mixture is pre-sintered at a temperature of 1150° C.-1250° C. and then re-ground before being pressed into the desired shape. In various embodiments, the pressed mixture is then sintered in air at 1400° C.-1500° C. before it is finally sintered in a reduced-oxygen atmosphere at 1350° C.-1450° C.

As an example, when forming MgTi ($Mg_2TiO_4$—$MgTiO_3$), high purity MgO and $TiO_2$ (99.95%) powders can be mixed as starting materials in the required proportions in a grinder (for example, an attritor or other grinder) for three hours. After drying and pre-sintering, the mixed powder can be re-ground in the grinder for an additional three hours. Ceramic elements of the required geometrical shape and size can then be prepared by hydraulic pressing, with a 10% solution of polyvinyl alcohol used as a binder.

The pressed material can then be pre-sintered in air until it exhibits substantially no water absorbance, and a porosity of less than 4%. The pre-sintering can be at approximately 1400-1500 degrees centigrade. The compressed mixture can then be sintered in an atmosphere that includes between 0.01% and 0.1% oxygen combined with one or more non-reactive gases. For example, the pressed mixture can be sintered at 1350-1450° C. in an atmosphere of 0.05% oxygen and 99.95% nitrogen for four hours. In general, lower oxygen concentrations are used for higher sintering temperatures. The resulting material in this example will have a dielectric constant of approximately 15, a tan d (loss tangent) of approximately $1.7 \times 10^{-4}$ at 7.5 GHz and $1.5 \times 10^{-5}$ at 650 MHz, and a DC bulk resistivity at room temperature between $10^{10}$ and $10^{11} \Omega \times m$.

Method of use embodiments of the present invention include forming a component from the disclosed ceramic, and implementing the component in an apparatus that implements charged particle beams. In embodiments, the method further comprises adjusting the bulk conductivity of the component to a desired value by controlling the temperature of the component, for example in the range of 20 to 150 degrees centigrade.

One general aspect of the present invention is a method of manufacturing a DC conductive low RF/microwave loss ceramic suitable for implementation in a charged particle beam apparatus. The method includes the following steps:
a) preparing a mixture of precursor ceramic powders that includes a titanium-oxide based ceramic powder;
b) pressing the mixed powders into a desired shape; and
c) sintering the pressed powders in an atmosphere having an oxygen concentration that is reduced in comparison to air.

Embodiments further include, between steps a) and b), a further step of pre-sintering the mixture of precursor ceramic powders in air. In some of these embodiments the pre-sintering is at a temperature that is between 1150° C. and 1250° C.

Any of the above embodiments can further include, between steps b) and c), a further step of re-sintering the pressed powders in an air atmosphere. In some of these embodiments, the re-sintering is at a temperature of between 1400° C. and 1500° C. In any of these embodiments, the re-sintering can be continued until the pressed powders exhibit substantially no water absorbance, and until a porosity of the pressed powders is less than 4%.

In any of the above embodiments, the sintering of step d) can be at a temperature that is between 1350° C. and 1450° C.

In any of the above embodiments, the precursor ceramic powders in step a) can be at least 99.9% pure.

In any of the above embodiments, step a) of the method can further include grinding the mixed powders.

Any of the above embodiments can further include, during step b), combining the mixed powders with a binder during pressing. In some of these embodiments the binder can be a 10% solution of polyvinyl alcohol.

In any of the above embodiments, the sintering in step c) can be performed in an atmosphere having an oxygen concentration of between 0.01% and 0.1% oxygen. In some of these embodiments, the between 0.01% and 0.1% oxygen of the atmosphere during the sintering of step c) can be mixed only with one or more unreactive gases, and in some of these embodiments the between 0.01% and 0.1% oxygen of the atmosphere during the sintering of step c) is mixed only with nitrogen, argon, or a combination of nitrogen and argon.

In any of the above embodiments, the sintering of the pressed powders in step c) can be at a temperature of between 1350° C. and 1450° C.

In any of the above embodiments, step c) can include sintering the pressed powders during a time period of at least two hours.

In any of the above embodiments, step c) can include sintering the pressed powders during a time period of at least four hours.

In any of the above embodiments, in step c) the atmosphere can consist of between 0.01% and 0.1% oxygen mixed with at least one of nitrogen and argon.

A second general aspect of the present invention is a composition of matter that includes a $Mg_2TiO_4$—$MgTiO_3$ ceramic having, at room temperature, a loss tangent (tan d) of less than $2 \times 10^{-4}$ at 7.5 GHz and less than $2 \times 10^{-5}$ at 650 MHz, and having a DC bulk resistivity at room temperature of less than $1 \times 10^{11}$ ohm-meters.

A third general aspect of the present invention is a component suitable for implementation in a charged particle beam apparatus. The component includes a structure formed from a ceramic containing titanium oxide and having, at room temperature, a loss tangent (tan d) of less than $5 \times 10^{-4}$ at both 7.5 GHz and at 650 MHz, and having a DC bulk resistivity at room temperature of less than $1 \times 10^{12}$ ohm-meters.

In embodiments, the ceramic is an $Mg_2TiO_4$—$MgTiO_3$ ceramic having, at room temperature, a loss tangent (tan d) of less than $2 \times 10^{-4}$ at 7.5 GHz and less than $2 \times 10^{-5}$ at 650 MHz, and having a DC bulk resistivity at room temperature of less than $1 \times 10^{11}$ ohm-meters.

And in any of these embodiments, the DC bulk resistivity of the component when the component is heated to 150° C. can be reduced by at least three orders of magnitude as compared to the bulk resistivity of the component at room temperature.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is a conductive titanium oxide ceramic (referred to herein as a "TiO" ceramic), and a method of manufacture thereof, wherein the ceramic includes $Ti^{3+}$ and/or $Ti^{4+}$ centers due to oxygen vacancies created by sintering the ceramic in a reduced oxygen environment. Here, "TiO" refers to any ceramic that includes titanium and oxygen in any ratio, for example $TiO_2$, $Ti_2O_3$, etc.

Before the disclosed sintering method is applied, these TiO ceramics have bulk resistivities in the range of $10^{13}$ to $10^{15}$, as is typical for dielectric materials that are conventionally used to form components implemented in charged particle beam apparatus. However, as a result of applying the process disclosed herein, the bulk resistivity of the claimed ceramic material is reduced by two to three orders of magnitude, while the loss tangent is increased by only about a factor of 2.

Some embodiments are based on an $MgO—CaO—TiO_2$ ceramic composition (referred to herein as an "MCT" ceramic) having a dielectric constant of between 18 and 140. Other embodiments are based on an $MgO—TiO_2$ ceramic composition (referred to herein as an "MT" ceramic) having a dielectric constant between 13 and 18. An exemplary embodiment is a $Mg_2TiO_4$—$MgTiO_3$ ceramic composition (referred to herein as a "MgTi" ceramic), having a DC bulk resistivity at room temperature that is reduced from a pre-sintered value of about $1\times10^{13}$ $\Omega\times m$ down to a resistivity after sintering of only between $5\times10^{10}$ and $1\times10^{11}$ $\Omega\times m$. At the same time, the disclosed sintering process increases the loss tangent of the MgTi ceramic of the exemplary embodiment by only about a factor of 2, from about $8\times10^{-5}$ up to about $1.7\times10^{-4}$ at 7.5 GHz, and from about $7\times10^{-6}$ up to about $1.4\times10^{-5}$ at 650 MHz The disclosed ceramic materials are therefore suitable for forming components that are implemented in charged particle based apparatus such as accelerators, vacuum electronic devices, electron microscopes, and such like, in that they have a sufficient bulk conductivity to avoid component damage due to DC electrical charge buildup, while at the same time maintaining a sufficiently low loss tangent to maintain RF/microwave transparency and minimize RF/microwave power loss.

The conductivity of the disclosed ceramic can be optimized according to the requirements of a specific implementation by adjusting the oxygen concentration of the surrounding atmosphere during sintering. Data that relates the percentage of oxygen during sintering to the resulting DC bulk resistivity of the disclosed ceramic for the exemplary $Mg_2TiO_4$—$MgTiO_3$ embodiment is numerically presented in Table 1 below, and is graphically presented in FIG. 1.

TABLE 1

| DC bulk resistivity of the disclosed MgTi ceramic as a function of oxygen concentration during sintering. | |
|---|---|
| % $O_2$ | Resistivity (ohm*m) |
| ≥1.0% | $2.4 \times 10^{+13}$ |
| 0.1% | $2.98 \times 10^{+12}$ |
| 0.05% | $1.06 \times 10^{+12}$ |
| | $1.05 \times 10^{+11}$ |
| | $1.082 \times 10^{+11}$ |
| $1 \times 10^{-4}$% (1 ppm) | $1.17 \, 10^{+7}$ |

Figure 1:
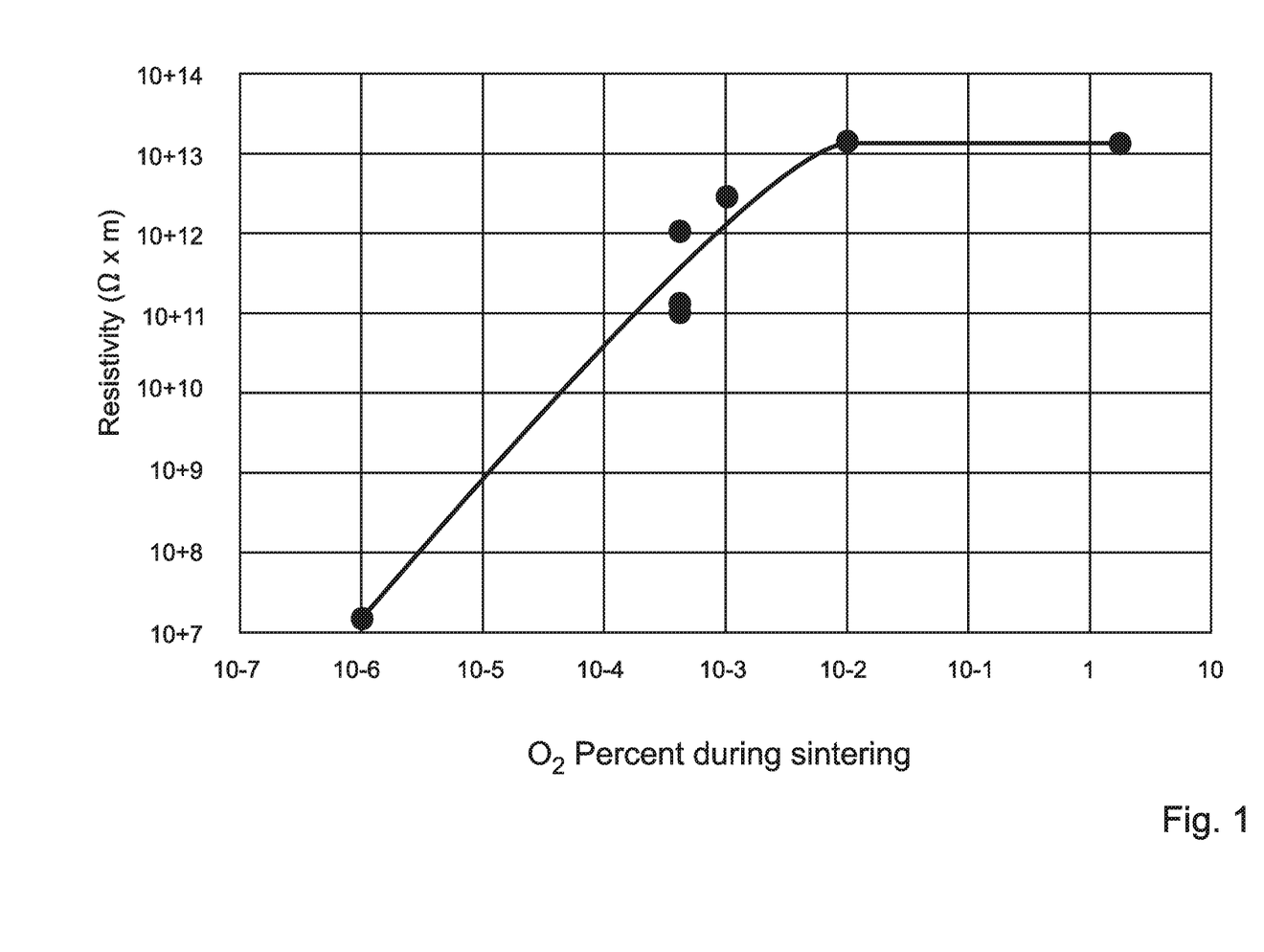
FIG. 1 is a plot of resistivity (DC bulk resistivity) as a function of oxygen concentration during sintering applicable to the exemplary embodiment ceramic of the present invention.
Figure 2:
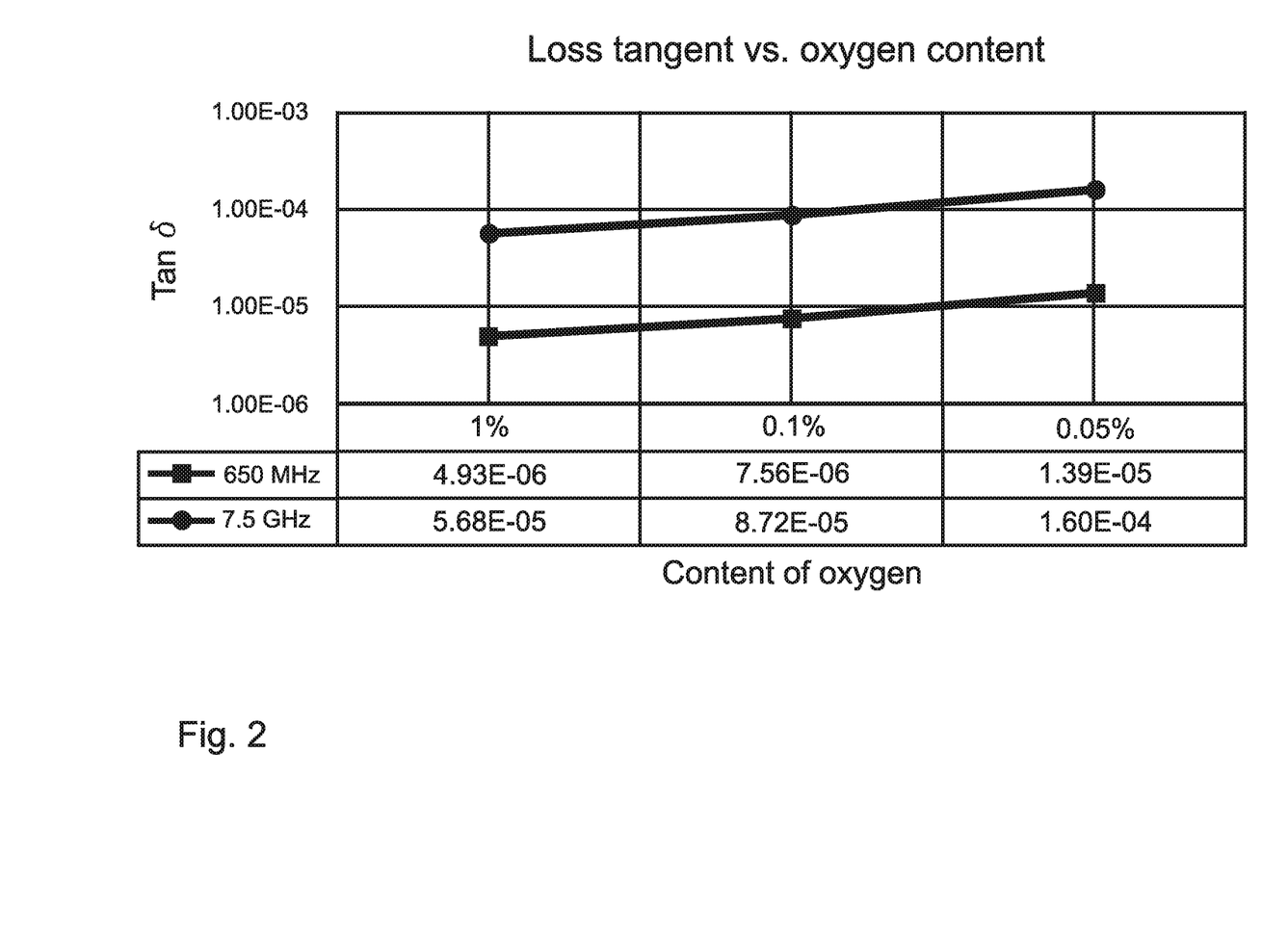
FIG. 2 is a plot of loss tangent as a function of oxygen concentration during sintering applicable to the exemplary embodiment ceramic of the present invention.

FIG. 2 presents graphical data that indicates the variation of the loss tangent (tan d) for the embodiment of FIG. 1 as a function of oxygen concentration during sintering.

Figure 3A:
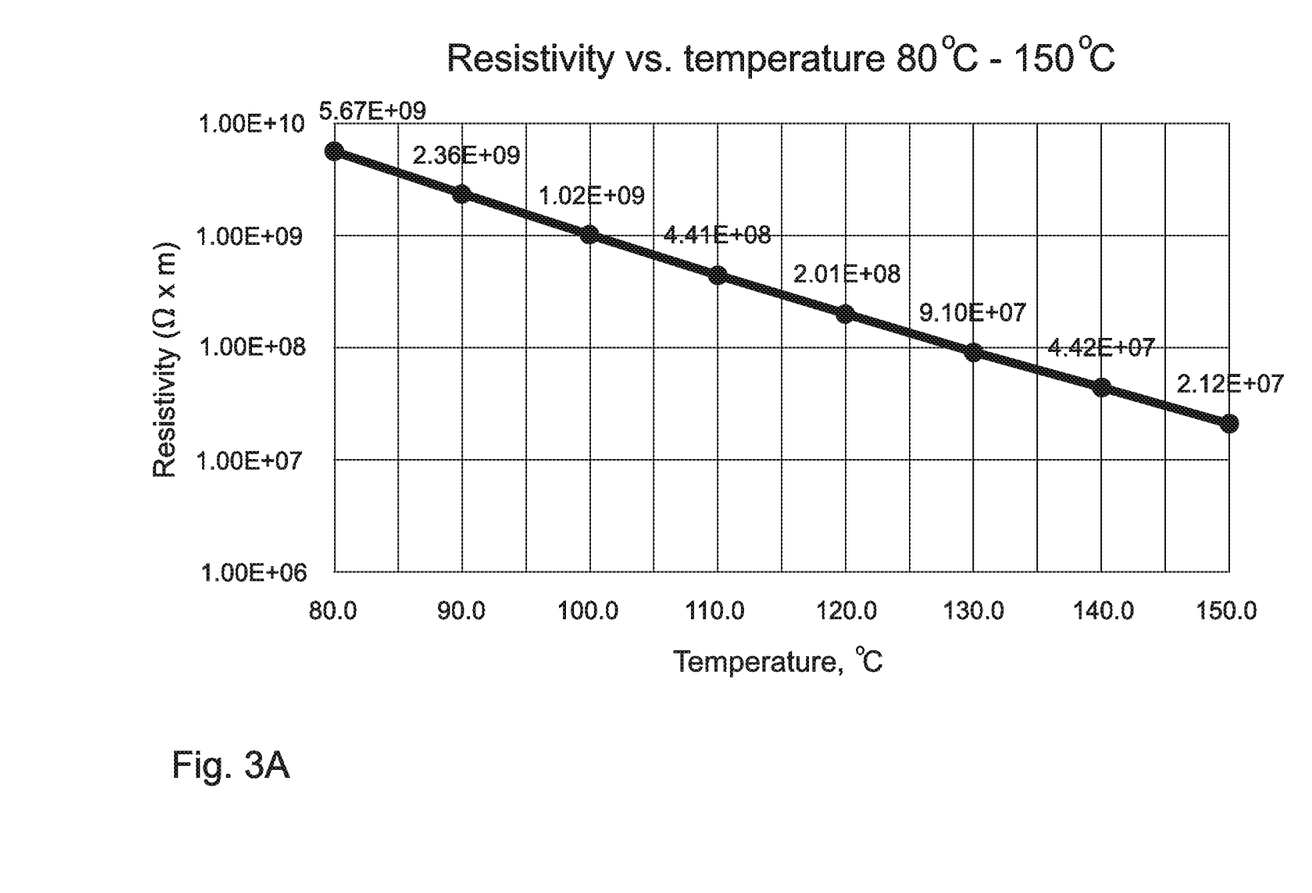
FIG. 3A is plot of resistivity as a function of sample temperature between 80° C. and 150° C., applicable to the exemplary embodiment ceramic of the present invention.

In embodiments, as the temperature of the disclosed TiO based ceramic is increased, its DC bulk resistivity can be further decreased by 3-4 orders of magnitude or more. As a result, varying the temperature of a component that is made from the disclosed ceramic material can also be used in embodiments as a mechanism for adjusting its conductivity to meet specific implementation requirements. With reference to FIG. 3A, when the exemplary embodiment of $Mg_2TiO_4$—$MgTiO_3$ is heated from room temperature to 150 degrees centigrade, its DC bulk resistivity is further decreased by 3 orders of magnitude, from $10^{10}\Omega\times m$ to below $10^{7}\Omega\times m$, while the increase in tan d is only about 20%. Conventional ceramics typically exhibit a dependence of tan d on temperature of as much as an order of magnitude over the same temperature range.

Figure 3B:
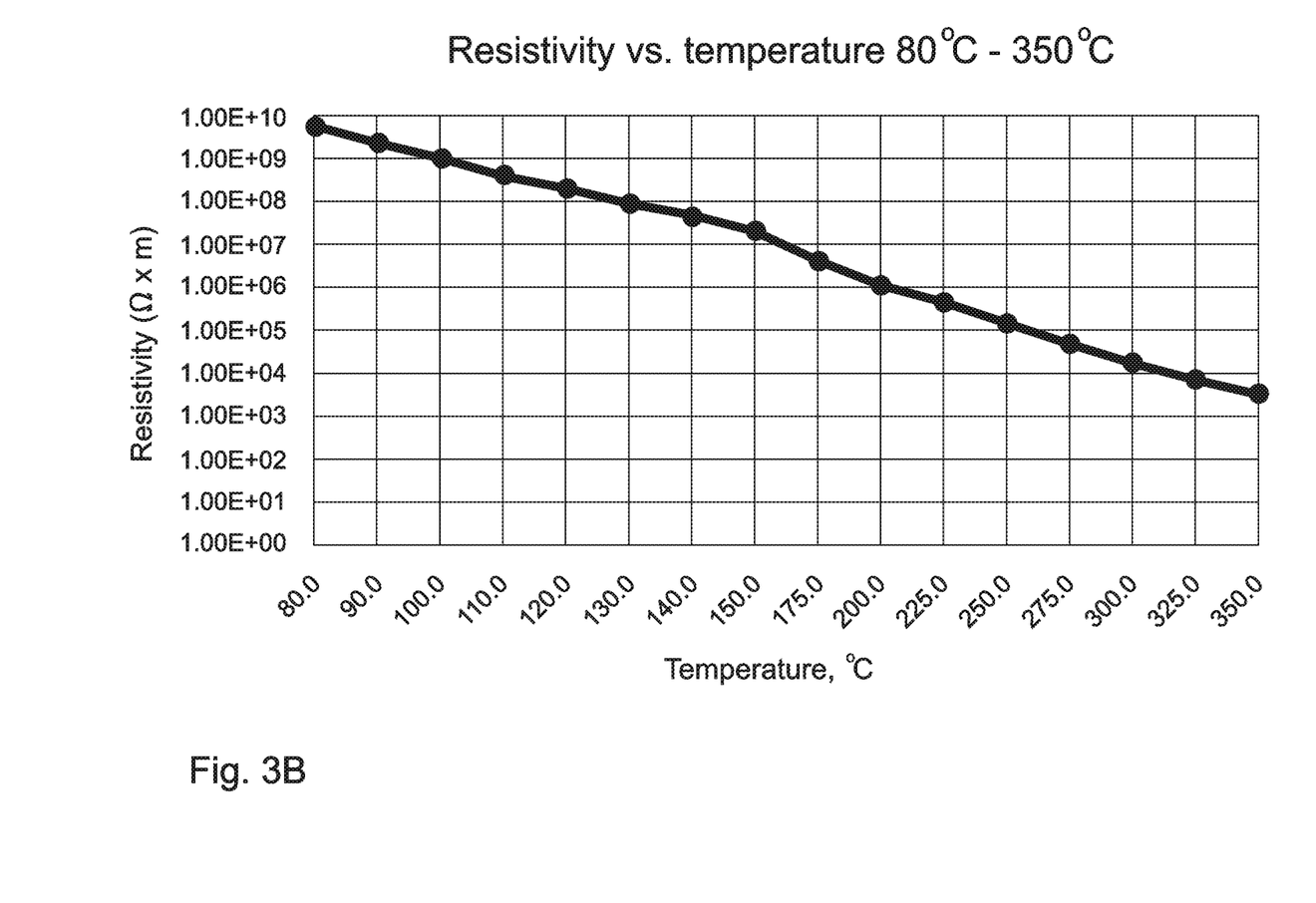
FIG. 3B is plot of resistivity as a function of sample temperature between 80° C. and 350° C., applicable to the exemplary embodiment ceramic of the present invention.

With reference to FIG. 3B, heating of the exemplary embodiment of FIG. 3A from room temperature to 300 degrees C. results in a conductivity increase of about eight orders of magnitude.

In embodiments, this variability of the bulk resistivity with temperature provides an additional method of discharging the ceramic components of charged particle beam apparatus by periodically heating the system, or by operating the system at an elevated temperature. In addition, this dependence of the conductivity on temperature can also be used as a mechanism for adjusting the bulk conductivity of a component made using the disclosed ceramic materials to meet specific implementation requirements.

The method of manufacturing the disclosed ceramic materials, according to the present invention, includes preparing a mixture of precursor ceramic powders that includes a titanium-oxide based ceramic powder, pressing the mixed powders into a desired shape; and sintering the pressed powders in an atmosphere having an oxygen concentration that is reduced in comparison to air.

Figure 4:
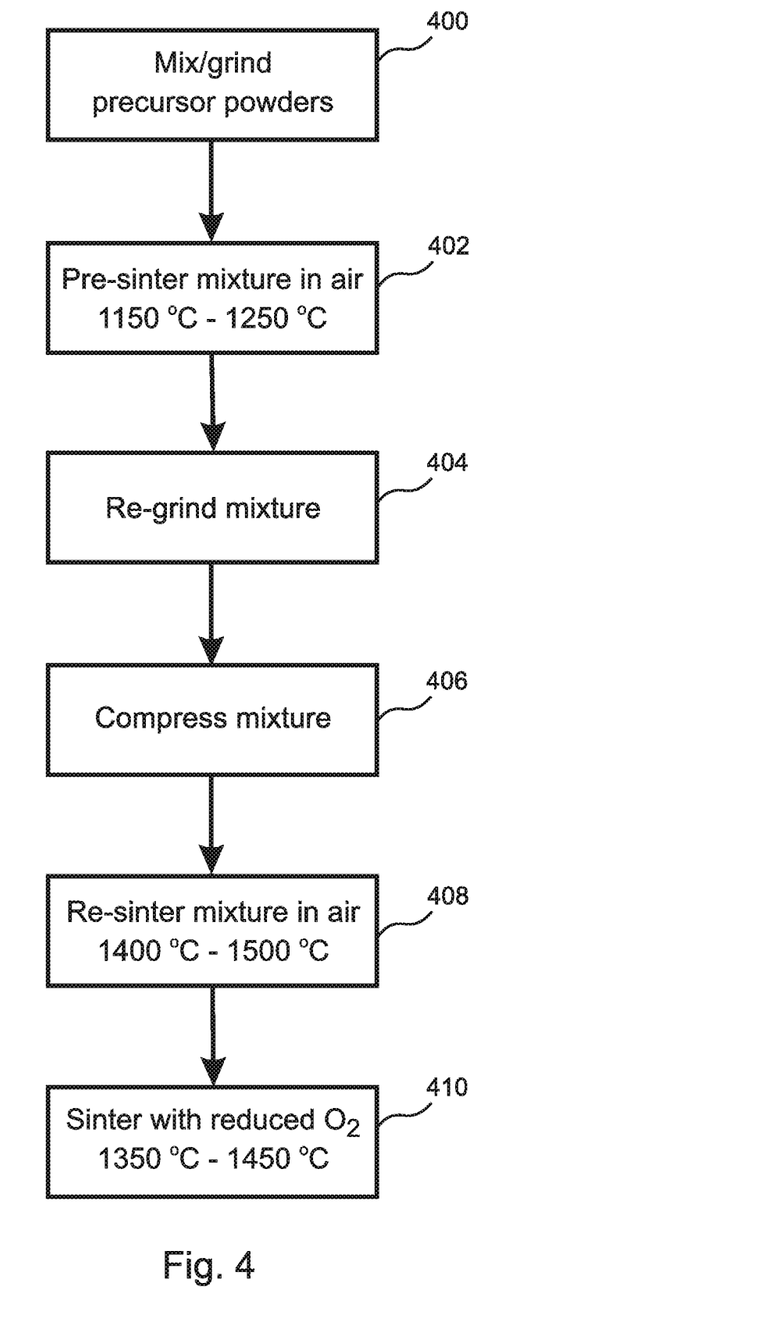
FIG. 4 is a flow diagram that illustrates a method embodiment of the present invention.

With reference to FIG. 4, embodiments of a method of manufacturing the exemplary MgTi ceramic include mixing/grinding precursor MgO powder with $TiO_2$ powder 400, pre-sintering the mixture in air at 1150°–1250° C. 402, grinding the mixture again 404, and compressing the mixture into a desired shape and size 406. The compressed mixture is then re-sintered at 1400°-1500° C. in air 408. In embodiments, this re-sintering 404 is continued until the pressed material exhibits substantially no water absorbance, having a porosity of less than 4%. Finally, the pressed material is sintered at 1350° C.-1450° C. in a reduced oxygen atmosphere, such as an atmosphere that includes between 0.01% and 0.1% oxygen combined with one or more non-reactive gases 410, such as nitrogen and/or argon. This reduced oxygen sintering 410 can be applied for a time period of at least 2 hours, and in embodiments at least 4 hours.

In embodiments, the precursor powders are at least 99.9% pure. The powders can be mixed and/or ground 400, 404 in a grinder (for example, in an attritor or other grinder). Either or both of the grinding steps 400, 404 can be performed for a period of at least three hours. The mixture can be combined with a binder during pressing 408, which can be a 10% solution of polyvinyl alcohol.

In an exemplary embodiment, MgO and $TiO_2$ powder of at least 99.95% purity are mixed and ground 400 in an attritor for three hours. After drying and pre-sintering 402, the mixture is re-ground in the attritor 404 for an additional three hours. The mixture is then hydraulically pressed 406 with a 10% polyvinyl solution used as a binder. The pressed mixture is pre-sintered 408 in air at 1400-1500 degrees centigrade, followed by sintering 410 at 1350-1450 degrees centigrade in an atmosphere of 0.05% oxygen and 99.95% nitrogen for four hours. The resulting material has a dielectric constant of approximately 15, a bulk resistivity of approximately $1.4 \times 10^{11}$ W×m, a tan d (loss tangent) of approximately $1.4 \times 10^{-5}$ at 650 MHz and a tan d of approximately $1.7 \times 10^{-4}$ at 7.5 GHz.

Method of use embodiments of the present invention include determining an optimal conductivity for a specified application, determining the corresponding oxygen concentration during sintering that will provide the determined optimal conductivity, and forming the component from the disclosed ceramic, wherein the sintering is performed at the determined oxygen concentration. In embodiments, the method further comprises adjusting the bulk resistivity of the component to a desired value after implementation by controlling the temperature of the component, for example in the range of 20 to 150 degrees centigrade.

Figure 5A:
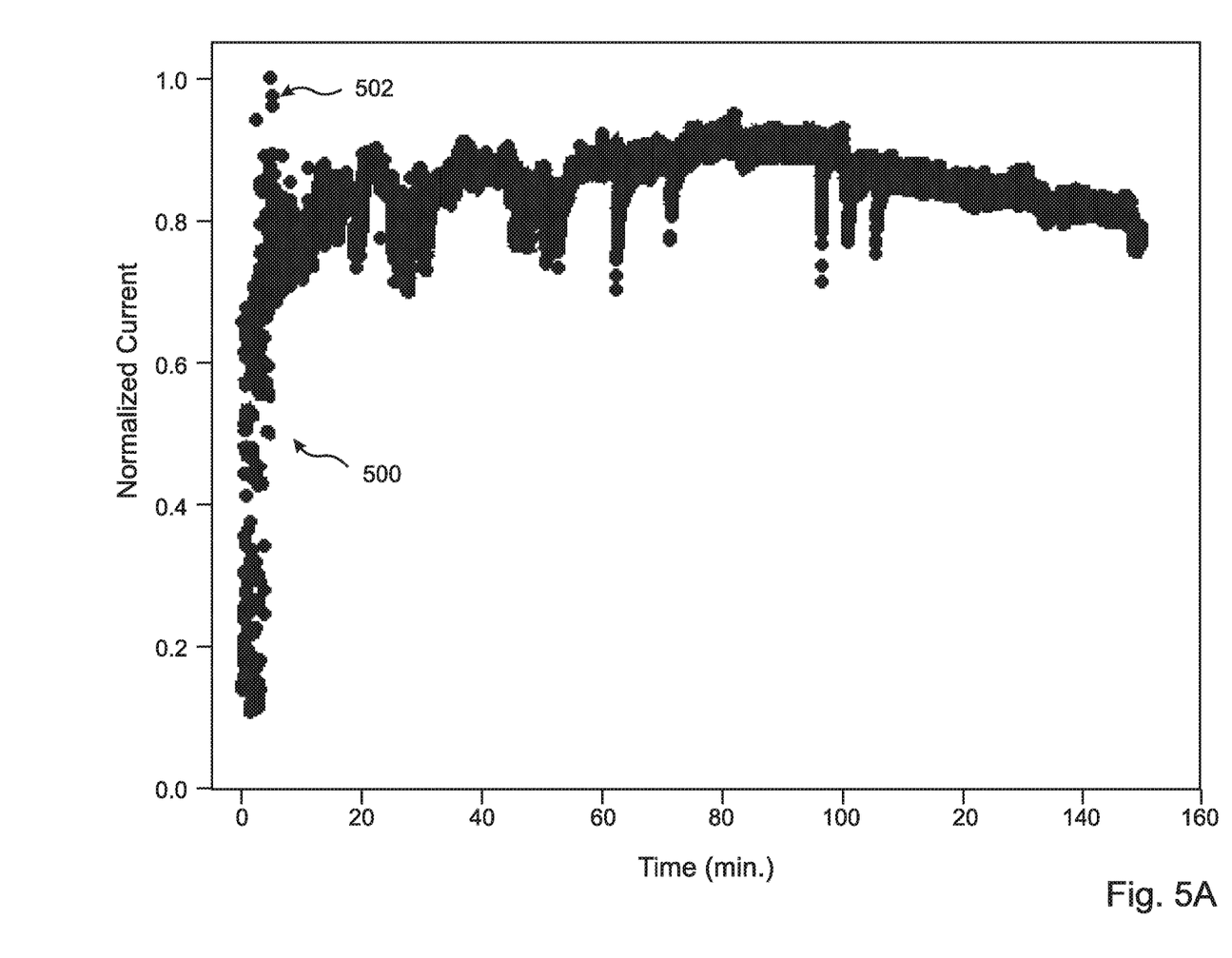
FIG. 5A is a plot as a function of time of current flowing out from a sample of a ceramic that was manufactured by sintering in air, measured during irradiation of the ceramic sample by an electron beam.
Figure 5B:
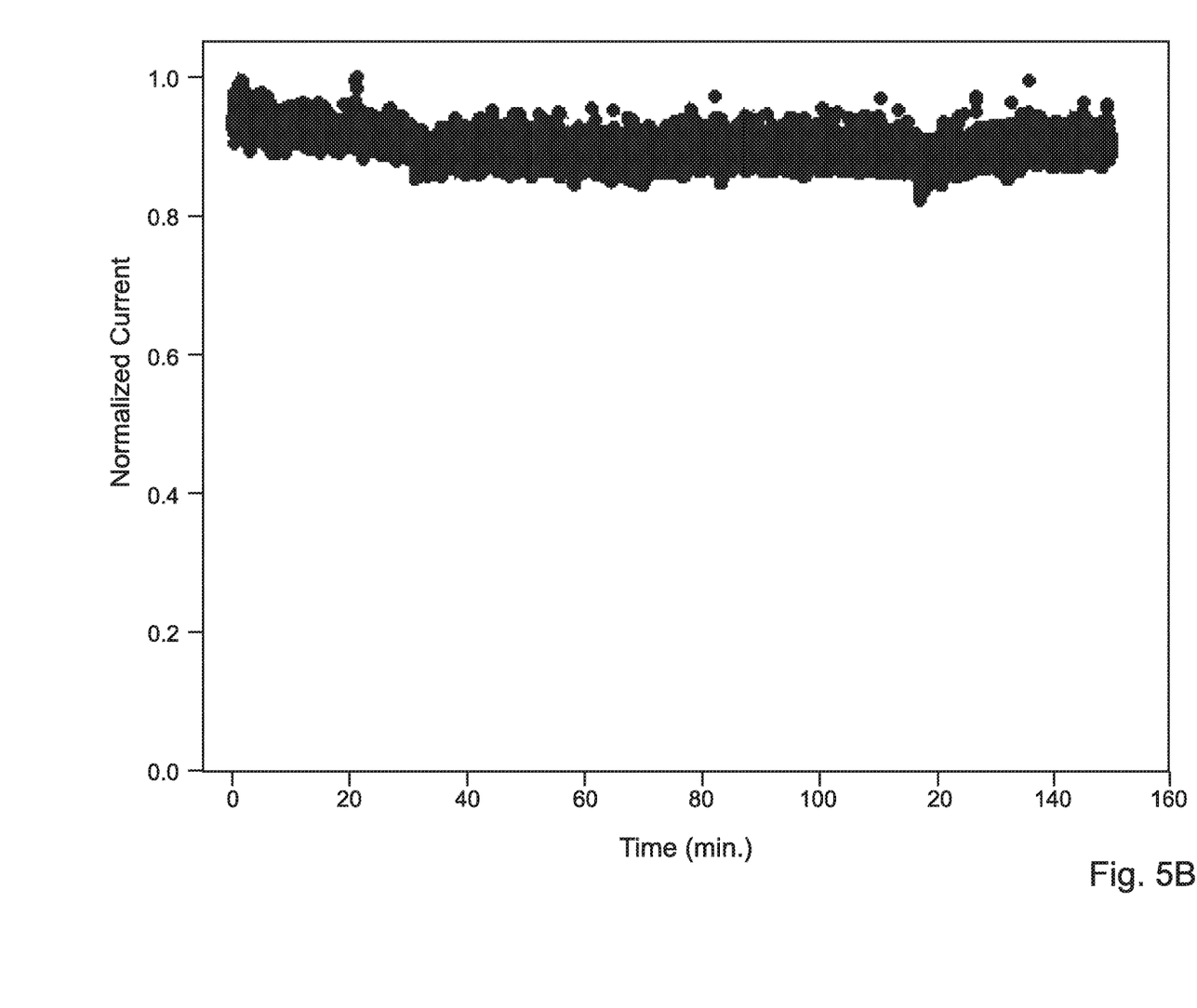
FIG. 5B is a plot as a function of time of current flowing out from a ceramic sample similar to FIG. 5A but manufactured according to an embodiment of the present invention, measured during irradiation of the ceramic sample by an electron beam.

FIGS. 5A and 5B present results of a comparative test performed on an MgTi ceramic sample prepared according to the exemplary embodiment described above, and on an MgTi ceramic sample that was otherwise identical, except that the final sintering step 410 was also performed in air. In each case, the ceramic sample to be tested was mounted in an aluminum holder that was electrically isolated from the rest of the system. A copper wire was clamped between a nut on the top plate of the holder and run to a high voltage meter configured to measure current. The holder and sample were mounted within a vacuum chamber and exposed to a continuous beam from an electron gun.

For each of the samples, the electric current flowing from the ceramic sample was monitored, indicating the degree of electrical charging of the ceramic as it was exposed to the electron beam. The electron gun filament was maintained at a fixed current to ensure beam stability and reproducibility. The beam was tightly focused to ensure that charge was imparted only to the ceramic sample. In each case, data was collected for 2.5 hours to study the time dependence of charging and discharging. FIG. 5A shows the data recorded using the sample that was sintered entirely in air, and FIG. 5B shows the data recorded using the sample for which the final sintering step was performed in an atmosphere of 0.05% oxygen and 99.05% nitrogen.

It can be seen from the figures that there is very little variation in the measured current, and hence very little variation in the DC electric charge, for the sample where the final sintering step was in 0.05% oxygen (FIG. 5B), indicating that the ceramic that was prepared according to the present invention was able to efficiently discharge the electrons that it received from the electron beam. In contrast, there is much more structure in the measured current of the sample that was sintered entirely in air (FIG. 5A). In particular, some initial charge buildup 500 occurred during approximately the first 5 minutes, followed by a discharge 502 indicated by the increased current. Over the next approximately 2.25 hours, a non-periodic behavior of charging (decreases in current) and discharging can be seen in FIG. 5A.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A method of manufacturing a DC conductive low RF/microwave loss ceramic suitable for implementation in a charged particle beam apparatus, the method comprising:
    a) preparing a mixture of precursor ceramic powders that includes a titanium-oxide based ceramic powder;
    b) pressing the mixed powders into a desired shape; and
    c) transforming the pressed powders into the ceramic by sintering the pressed powders in an atmosphere having an oxygen concentration that is reduced in comparison to air, wherein the ceramic has, at room temperature, a loss tangent (tan d) of less than $2 \times 10^{-4}$ at 7.5 GHz and less than $2 \times 10^{-5}$ at 650 MHz, and has a DC bulk resistivity at room temperature of less than $1 \times 10^{11}$ ohm-meters.

2. The method of claim 1, further comprising between steps a) and b) a further step of pre-sintering the mixture of precursor ceramic powders in air.

3. The method of claim 2, wherein the pre-sintering is at a temperature that is between 1150° C. and 1250° C.

4. The method of claim 1, further comprising between steps b) and c) a further step of re-sintering the pressed powders in an air atmosphere.

5. The method of claim 4, wherein the re-sintering is at a temperature of between 1400° C. and 1500° C.

6. The method of claim 4, wherein the re-sintering is continued until the pressed powders exhibit substantially no water absorbance, and until a porosity of the pressed powders is less than 4%.

7. The method of claim 1, wherein the sintering of step c) is at a temperature that is between 1350° C. and 1450° C.

8. The method of claim 1, wherein the precursor ceramic powders in step a) are at least 99.9% pure.

9. The method of claim 1, wherein step a) of the method further comprises grinding the mixed powders.

10. The method of claim 1, further comprising during step b) combining the mixed powders with a binder during pressing.

11. The method of claim 10, wherein the binder is a 10% solution of polyvinyl alcohol.

12. The method of claim 1, wherein the sintering in step c) is performed in an atmosphere having an oxygen concentration of between 0.01% and 0.1% oxygen.

13. The method of claim 12, wherein the between 0.01% and 0.1% oxygen of the atmosphere during the sintering of step c) is mixed only with one or more unreactive gases.

14. The method of claim 12, wherein the between 0.01% and 0.1% oxygen of the atmosphere during the sintering of step c) is mixed only with nitrogen, argon, or a combination of nitrogen and argon.

15. The method of claim 1, wherein the sintering of the pressed powders in step c) is at a temperature of between 1350° C. and 1450° C.

16. The method of claim 1, wherein step c) includes sintering the pressed powders during a time period of at least two hours.

17. The method of claim 1, wherein step c) includes sintering the pressed powders during a time period of at least four hours.

18. The method of claim 1, wherein in step c) the atmosphere consists of between 0.01% and 0.1% oxygen mixed with at least one of nitrogen and argon.

\* \* \* \* \*

UNITED STATES PATENT AND TRADEMARK OFFICE
CERTIFICATE OF CORRECTION

PATENT NO. : 11,773,026 B2
APPLICATION NO. : 17/019441
DATED : October 3, 2023
INVENTOR(S) : Alexei Kanareykin and Elizaveta Arkadievna Nenasheva It is certified that error appears in the above-identified patent and that said Letters Patent is hereby corrected as shown below:

In the Specification

Replace Column 1, Lines 6-9 with the following text:
This invention was made with government support under DE-SC0017150 awarded by the U.S. Department of Energy. The government has certain rights in the invention.

Signed and Sealed this
Tenth Day of September, 2024

*Katherine Kelly Vidal*

Katherine Kelly Vidal
*Director of the United States Patent and Trademark Office*